(12) United States Patent
Lee et al.

(10) Patent No.: US 11,204,518 B2
(45) Date of Patent: Dec. 21, 2021

(54) DISPLAY PANEL AND MANUFACTURING METHOD THEREOF

(71) Applicant: Samsung Display Co., Ltd., Yongin-Si (KR)

(72) Inventors: Chang-Hun Lee, Hwaseong-si (KR); Min-Jae Kim, Suwon-si (KR); Min-Hee Kim, Ansan-si (KR); Taehoon Kim, Suwon-si (KR); Kyunghae Park, Seongnam-si (KR); Joon-Hyung Park, Seoul (KR); Danbi Yang, Gunpo-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/687,542

(22) Filed: Nov. 18, 2019

(65) Prior Publication Data
US 2020/0257162 A1    Aug. 13, 2020

(30) Foreign Application Priority Data

Feb. 7, 2019    (KR) .......................... 10-2019-0014570

(51) Int. Cl.
*H01L 27/32*    (2006.01)
*H01L 51/50*    (2006.01)
(Continued)

(52) U.S. Cl.
CPC .. *G02F 1/133512* (2013.01); *G02F 1/133514* (2013.01); *H01L 27/322* (2013.01);
(Continued)

(58) Field of Classification Search
CPC .............. H01L 27/3218; H01L 27/322; H01L 27/3246; H01L 51/502; H01L 51/5253;
(Continued)

(56) References Cited

U.S. PATENT DOCUMENTS 7,078,348 B1    7/2006 Singh et al.
10,756,154 B2 *   8/2020 Kim .................... H01L 51/5253
(Continued)

FOREIGN PATENT DOCUMENTS

CN    107731873 A    2/2018
EP    3435149 A1    1/2019
(Continued)

OTHER PUBLICATIONS

Ando et al., Wavelength Dependence of Refractive Indices of Polyimides in Visible and Near-IR Regions, Japanese Journal of Applied Physics, 41, pp. 5254-5258, 2002. (Year: 2002).*

(Continued)

*Primary Examiner* — Mary A Wilczewski
(74) *Attorney, Agent, or Firm* — Innovation Counsel LLP

(57) ABSTRACT

A display panel includes an upper display substrate and a lower display substrate. The upper display substrate includes a base substrate, a light shielding pattern, and including an opening part defined therein which corresponds to the pixel region, a color filter overlapped with the pixel region, an encapsulation layer disposed in lower sides of the light shielding pattern and the color filter, a partition wall disposed in a lower side of the encapsulation layer, overlapped with the light shielding region, and including a partition wall opening part defined therein which corresponds to the pixel region, and a quantum dot layer disposed inside the partition wall opening part. The partition wall includes a first layer directly disposed on the bottom surface of the encapsulation layer and a second layer directly disposed on a lower side of the first layer and having a larger optical density than the first layer.

15 Claims, 16 Drawing Sheets

(51) Int. Cl.
  *H01L 51/52* (2006.01)
  *G02F 1/1335* (2006.01)
  *G02F 1/1339* (2006.01)
  *H01L 51/00* (2006.01)

(52) U.S. Cl.
  CPC ...... *H01L 27/3218* (2013.01); *H01L 27/3246* (2013.01); *H01L 51/502* (2013.01); *H01L 51/5253* (2013.01); H01L 51/0024 (2013.01); H01L 51/5284 (2013.01)

(58) Field of Classification Search
  CPC ............. H01L 51/0024; H01L 51/5281; H01L 51/525; H01L 51/56; H01L 2251/56; G02F 1/133512; G02F 1/133514
  See application file for complete search history.

(56) References Cited

U.S. PATENT DOCUMENTS

| | | |
|---|---|---|
| 2003/0076608 A1 | 4/2003 | Yudasaka |
| 2003/0137242 A1* | 7/2003 | Seki ............... H01L 27/3246 313/506 |
| 2004/0181008 A1 | 9/2004 | Hanazawa et al. |
| 2007/0216832 A1* | 9/2007 | Takahashi ......... G02F 1/133516 349/106 |
| 2009/0028910 A1 | 1/2009 | DeSimone et al. |
| 2011/0128643 A1* | 6/2011 | Nakamata ............. G02B 5/201 359/891 |
| 2014/0146410 A1* | 5/2014 | Lo ................... G02F 1/133514 359/891 |
| 2015/0301422 A1* | 10/2015 | Miyake ................ G06F 3/0412 349/38 |
| 2016/0372528 A1 | 12/2016 | Kamura et al. |
| 2019/0027547 A1* | 1/2019 | Kim .................. H01L 51/5253 |
| 2019/0121176 A1* | 4/2019 | Lee .................. G02F 1/133617 |
| 2019/0196242 A1* | 6/2019 | Nomura ............... H01L 27/124 |
| 2019/0384128 A1* | 12/2019 | Hong ............... G02F 1/133514 |
| 2019/0386253 A1 | 12/2019 | Li et al. |
| 2020/0219935 A1* | 7/2020 | Ahn ..................... H01L 51/525 |
| 2020/0257162 A1* | 8/2020 | Lee .................... H01L 27/322 |
| 2020/0321400 A1* | 10/2020 | Park ................... H01L 27/3244 |
| 2020/0373359 A1* | 11/2020 | Lee .................... H01L 27/3246 |
| 2021/0126055 A1* | 4/2021 | Lee ................... H01L 51/5284 |
| 2021/0202587 A1* | 7/2021 | Kim ................... H01L 51/502 |
| 2021/0225943 A1* | 7/2021 | Park .................. H01L 51/5284 |

FOREIGN PATENT DOCUMENTS

| | | | | |
|---|---|---|---|---|
| EP | 3 693 999 | * | 8/2020 | ............. H01L 27/32 |
| KR | 10-0799962 B1 | | 1/2008 | |
| KR | 10-2012-0105062 A | | 9/2012 | |
| KR | 10-2015-0129551 A | | 11/2015 | |
| KR | 10-2016-0056335 A | | 5/2016 | |
| WO | WO 2010/150353 | * | 12/2010 | ............. H01L 27/32 |

OTHER PUBLICATIONS

American Institute of Physics Handbook, Third Edition, Section 6g. Optical Properties of Metals, Lawrence Hadley, pp. 6-118 to 6-160, 1972. (Year: 1972).*

Jihye Lee, Sang-Wook Chun, Ho-Jong Kang, and Frank E. Talke, "The Effect of UV Stabilizer on the Photo Degradation of Perfluoropolyether Lubricants Used in Hard Disk", Paper, / Accepted: Jul. 30, 2007 / Published online: Aug. 16, 2007, 6 pages, Tribol Lett (2007) 28:117-121 DOI 10.1007/s11249-007-9255-4, https://www.researchgate.net/publication/225473084. (c) Springer Science+ Business Media, LLC 2007.

V. Anand Ganesh, Saman Safari Dinachali, Sundaramurthy Jayaraman, Radhakrishnan Sridhar, Hemant Kumar Raut Aleksander G'ora, Avinash Baji, A. Sreekumaran Nair*f and Seeram Ramakrishna*bc, "One-step fabrication of robust and optically transparent slippery coatings", paper, Accepted Oct. 10, 2014 DOI: 10.1039/c4ra08655d, RSC Adv., 2014, 4, 55263-55270 (8 pages), This journal is © The Royal Society of Chemistry 2014, RSC Advances.

* cited by examiner

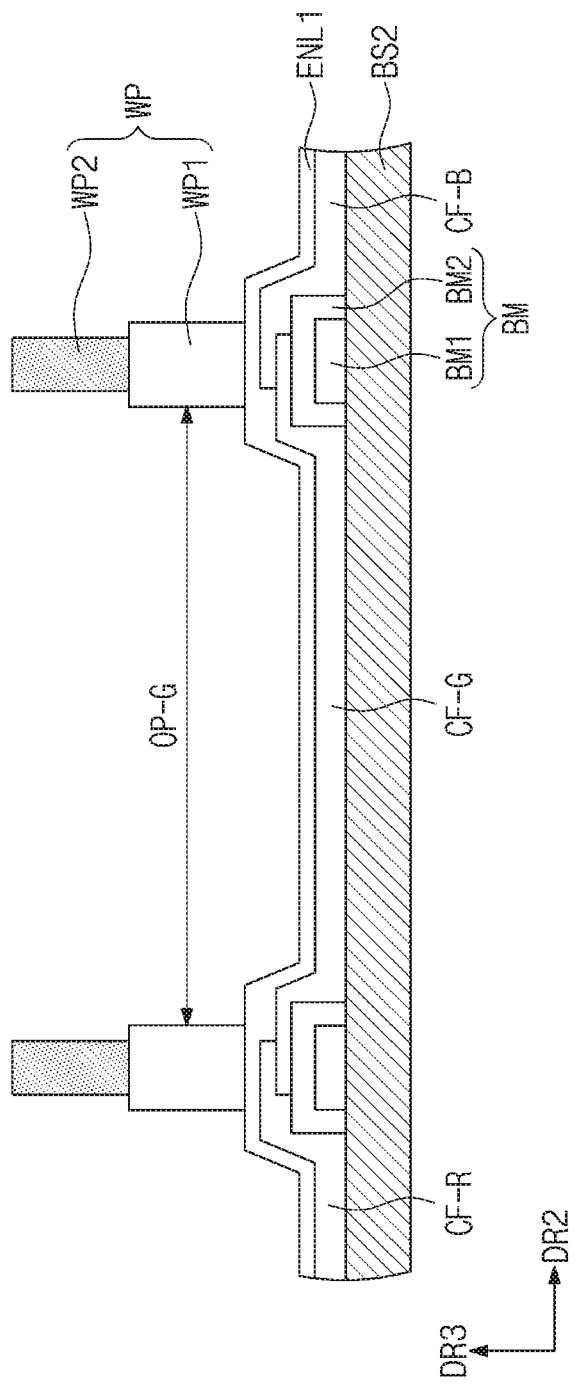

DISPLAY PANEL AND MANUFACTURING METHOD THEREOF

CROSS-REFERENCE TO RELATED APPLICATIONS

This U.S. non-provisional patent application claims priority under 35 U.S.C. § 119 to Korean Patent Application No. 10-2019-0014570, filed on Feb. 7, 2019, the entire contents of which are hereby incorporated by reference.

BACKGROUND

The present disclosure herein relates to a display panel and a fabrication method thereof, and more particularly, to a display panel including a partition wall and a fabrication method thereof.

A display panel includes a transmissive panel that selectively transmits source light generated by an optical source and an emissive display panel in which source light is generated. The display panel may include different kinds of color control layers according to pixels so as to generate a color image. The color control layers may transmit only some wavelength ranges of the source light or change the color of the source light. Some color control layers may change characteristics of the source light without changing the color thereof.

SUMMARY

The present disclosure provides a display panel in which the luminance increases and color mixture is prevented.

The present disclosure also provides a method of fabricating a display panel in which an amount of material consumption is reduced.

An embodiment of the inventive concept provides a display panel including: an upper display substrate including first, second and third pixel regions, and a light shielding region in a periphery of the first, second and third pixel regions; and a lower display substrate including first, second and third display elements respectively corresponding to the first, second and third pixel regions, wherein the upper display substrate includes: a base substrate; a light shielding pattern disposed on a bottom surface of the base substrate, overlapped with the light shielding region, and including first, second and third opening parts defined therein which respectively correspond to the first, second and third pixel regions; first, second and third color filters disposed on the bottom surface of the base substrate and respectively overlapped with the first, second and third pixel regions; a partition wall disposed in a lower side of the first, second and third color filters, overlapped with the light shielding region, and including first, second and third partition wall opening parts defined therein which respectively correspond to the first, second and third pixel regions; and first, second and third color control layers respectively disposed in the first, second and third partition wall opening parts, wherein the partition wall includes a first layer and a second layer directly disposed on a lower side of the first layer and having an optical density greater than that of the first layer, and a part of the second layer protrudes downwards from the first, second and third color control layers in a cross sectional view.

In an embodiment, the optical density of the second layer may be from about 0.15 to about 0.5 when a thickness of the second layer is 1 μm.

In an embodiment, the second layer may include a hydrophobic region and a hydrophilic region disposed between the hydrophobic region and the first layer.

In an embodiment, the second layer may have a thickness of from about from 7 μm to about 10 μm.

In an embodiment, the hydrophilic region includes a base resin and a black coloring agent mixed with the base resin, and the hydrophobic region includes a hydrophobic agent chemically bonded to the base resin.

In an embodiment, the hydrophobic region may have a thickness of from about 30 nm to about 200 nm.

In an embodiment, each of the first, second and third color control layers may have a thickness of about 15 μm or lager.

In an embodiment, a height of the partition wall in the light shielding region may be higher than that of each of the first, second and third color control layers.

In an embodiment, a thickness of the first layer may be from about 5 μm to about 15 μm, and a thickness of the second layer may be from about 5 μm to about 10 μm.

In an embodiment, a width of the first layer may be from about 10 μm to about 15 μm.

In an embodiment, the second layer may be completely overlapped with the first layer in a plan view.

In an embodiment, the light shielding pattern may include a first light shielding layer of a blue color and a second light shielding layer of a black color, which covers at least a bottom surface of the first light shielding layer.

In an embodiment, each of the first, second and third display elements may include a first electrode, a second electrode, and an emission layer disposed between the first electrode and the second electrode, and the emission layers of the first, second and third display elements may have an integrated shape and generate blue light.

In an embodiment, the first color control layer may include a first quantum dot configured to convert the blue light into red light, the second color control layer may include a second quantum dot configured to convert the blue light into green light, and the third color control layer may transmit the blue light.

In an embodiment of the inventive concept, a display panel includes: an upper display substrate including a pixel region and a peripheral region in a periphery of the pixel region; and a lower display substrate including a display element disposed to correspond to the pixel region, wherein the upper display substrate includes: a base substrate; a light shielding pattern disposed on a bottom surface of the base substrate, overlapped with the peripheral region, and including an opening part defined therein which corresponds to the pixel region; a color filter disposed on the bottom surface of the base substrate and overlapped with the pixel region; an encapsulation layer disposed on lower sides of the light shielding pattern and the color filter; a partition wall disposed on a lower side of the encapsulation layer, overlapped with the peripheral region, and including a partition wall opening part defined therein which corresponds to the pixel region; and a quantum dot layer disposed in the partition wall opening part, wherein the partition wall includes a first layer directly disposed on the bottom surface of the encapsulation layer and a second layer directly disposed in a lower side of the first layer and having a larger optical density than the first layer.

In an embodiment of the inventive concept, a manufacturing method of a display device includes: manufacturing a first display substrate including a display element; manufacturing a second display substrate including a pixel region corresponding to the display element, and a light shielding region in a periphery of the pixel region; and bonding the first substrate and the second substrate, wherein the manufacturing of the second display substrate includes: forming a light shielding pattern on a base substrate so as to be overlapped with the light shielding region; forming a color filter overlapped with the pixel region; forming a first preliminary partition wall layer on the base substrate; exposing the first preliminary partition wall layer so that a first region overlapped with the light shielding pattern of the first preliminary partition wall layer is divided from a second region disposed in a periphery of the first region; forming a second preliminary partition wall layer on the exposed first preliminary partition wall layer; exposing the second preliminary partition wall layer so that a third region corresponding to the first region of the second preliminary partition wall layer is divided from a fourth region corresponding to the second region; developing the first preliminary partition wall layer and the second preliminary partition wall layer so that to form a partition wall and a partition wall opening part surrounded by the partition wall; and forming a quantum dot layer in the partition wall opening part.

In an embodiment, the forming of the second preliminary partition wall layer may include: forming a composition layer including a base resin, a black coloring agent, and a hydrophobic agent on the first preliminary partition wall layer; drying the composition layer; and primarily baking the composition layer so as to provide heat thereto.

In an embodiment, the primarily baked composition layer may include a hydrophilic region including the base resin and the black coloring agent, and a hydrophobic region including the hydrophobic agent chemically bonded to the base resin.

In an embodiment, the display panel may further include, after the developing, secondarily baking the partition wall so as to provide heat thereto, wherein the temperature in the secondarily baking is higher than that in the primarily baking.

In an embodiment, the forming of the first preliminary partition wall layer may include: forming a composition layer including the base resin on the base substrate; drying the composition layer; and baking the composition layer so as to provide heat thereto.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5A, 5B, 5C, 5D and 5E are drawings illustrating a fabrication method of an upper display substrate according to an embodiment of the inventive concept;

DETAILED DESCRIPTION

Figure 1A:
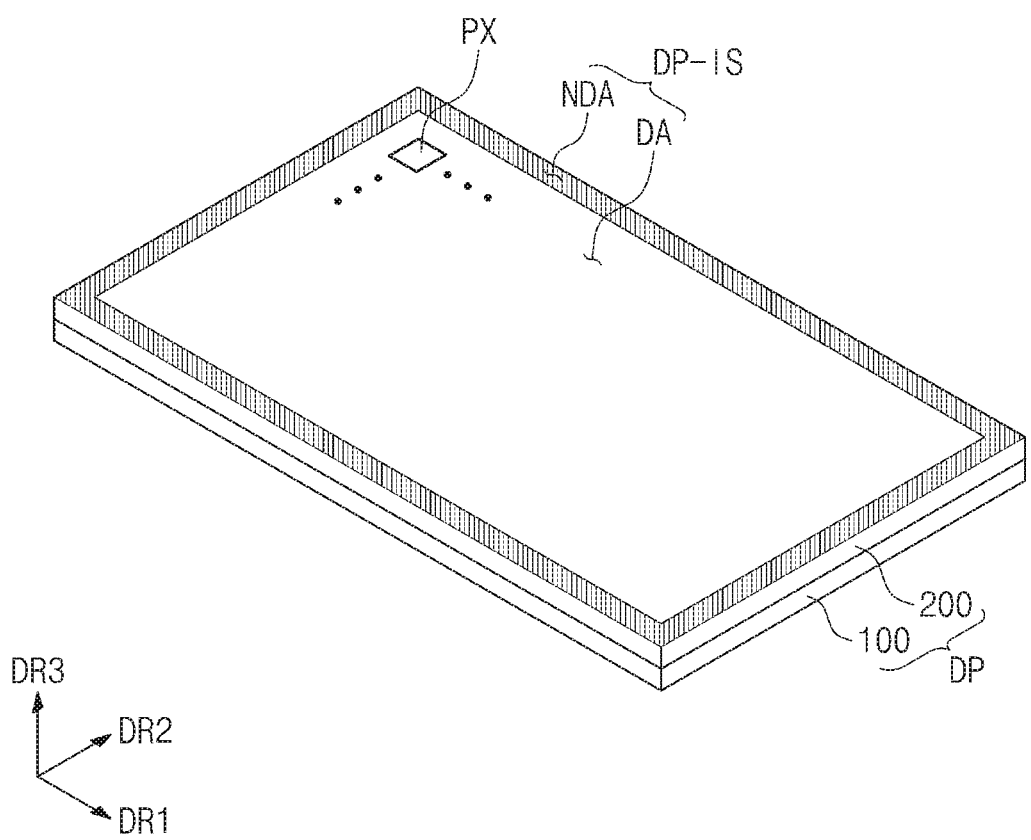
FIG. 1A is a perspective view of a display panel according to an embodiment of the inventive concept.

The inventive concept may be variously modified and realized in various forms, and thus specific embodiments will be exemplified in the drawings and described in detail hereinbelow. However, it will be understood that the inventive concept is not intended to be limited to the specific forms set forth herein, and all changes, equivalents, and substitutions included in the technical scope and spirit of the inventive concept are included.

Referring to the drawings, like reference numerals refer to like components throughout. In the accompanying drawings, the dimensions of the structures may be exaggerated or reduced for clarity of illustration. Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present disclosure. The singular forms "a," "an" and "the" are intended to include the plural forms as well, unless the context clearly indicates otherwise.

It will be understood that the terms "comprises" or "have," when used in this specification, are intended to specify the presence of stated features, integers, steps, operations, components, a combination thereof, but do not preclude the presence or addition of one or more other features, integers, steps, operations, components, or a combination thereof.

Figure 1B:
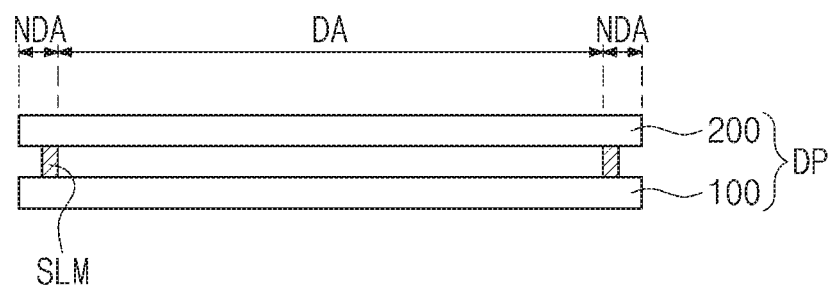
FIG. 1B is a cross-sectional view of a display panel according to an embodiment of the inventive concept.
Figure 2:
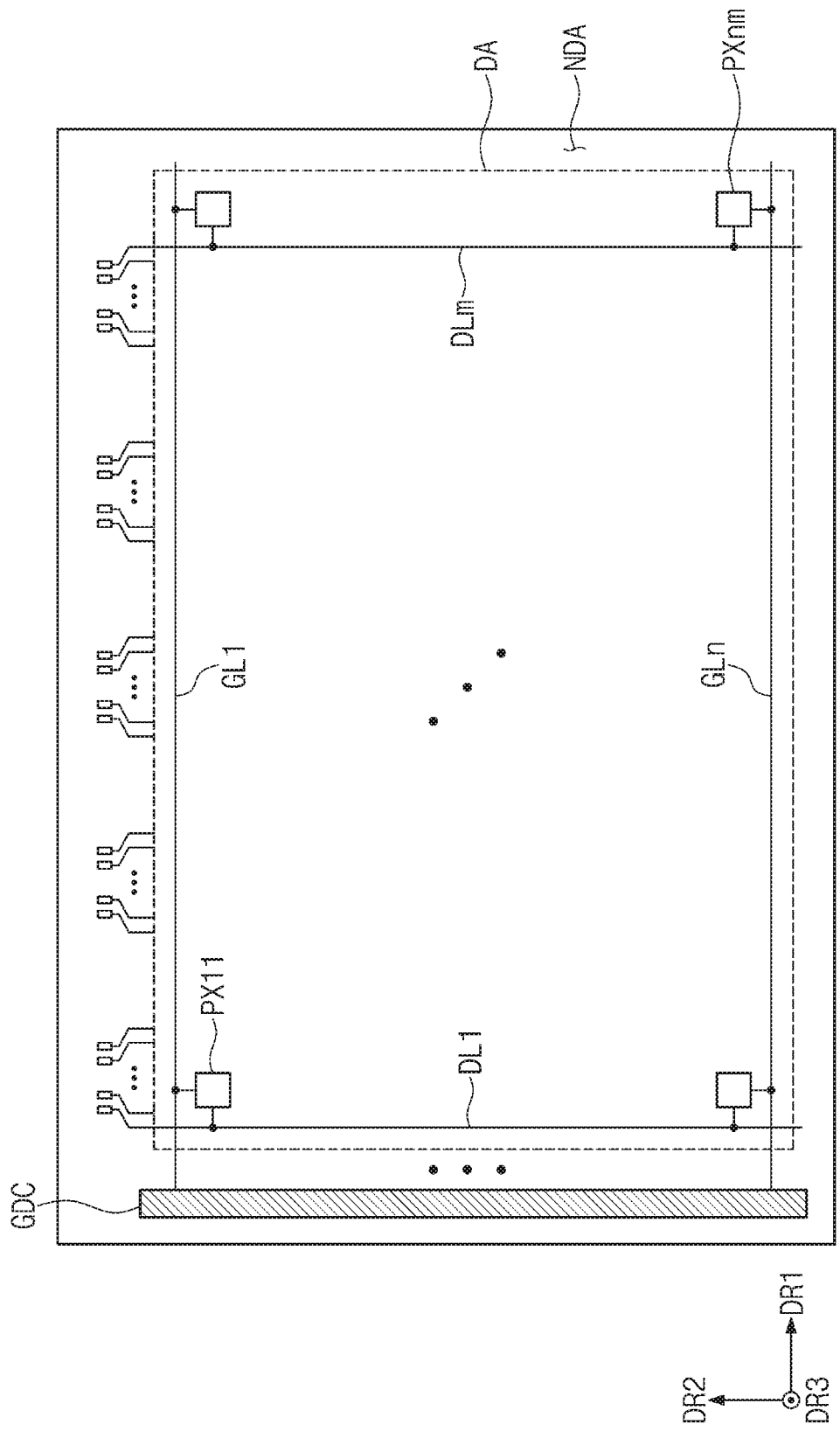
FIG. 2 is a plan view of a display panel according to an embodiment of the inventive concept.

FIG. 1A is a perspective view of a display panel DP according to an embodiment of the inventive concept. FIG. 1B is a cross-sectional view of a display panel DP according to an embodiment of the inventive concept. FIG. 2 is a plan view of a display panel DP according to an embodiment of the inventive concept.

Figure 1B:
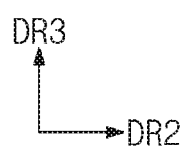

With reference to FIG. 1A to FIG. 2, the display panel DP may be any one among a liquid crystal display panel, an electrophoretic display panel, a microelectromechanical system (MEMS) display panel, an electrowetting display panel, and an organic light emitting display panel, but is not particularly limited thereto.

Although not shown separately, the display panel DP may further include a chassis member or a molding member, and further include a backlight unit according to the type of the display panel DP.

The display panel DP may include a first display substrate 100 (or a lower display substrate) and a second display substrate 200 (or an upper display substrate) facing and spaced apart from the first display substrate 100. A prescribed cell gap may be formed between the first display substrate 100 and the second display substrate 200. The cell gap may be maintained by a sealant SLM that bonds the first display substrate 100 and the second substrate 200. A grayscale display layer for image generation may be disposed between the first display substrate 100 and the second display substrate 200. The grayscale display layer may include a liquid crystal display layer, an organic light emitting display layer, and an electrophoretic display layer according to the type of the display panel.

As illustrated in FIG. 1A, the display panel DP may display an image on a display surface DP-IS. The display surface DP-IS is parallel to a surface defined by a first directional axis DR1 and a second directional axis DR2. The display surface DP-IS may include a display region DA and a non-display region NDA. Pixels PX are disposed in the display region DA and the pixels PX are not disposed in the non-display region NDA. The non-display region NDA is defined along the edge of the display surface DP-IS. The display region DA may be surrounded by the non-display region NDA.

A normal direction of the display surface DP-IS, namely, the thickness direction of the display panel DP, is indicated by a third directional axis DR3. The front surfaces (or upper surfaces) and the rear surfaces (or lower surfaces) of respective layers or units, which will be described hereinafter, are defined by the third directional axis DR3. However, the first to third directional axes DR1, DR2, and DR3 shown in the present embodiment are only an example. Hereinafter, the first to third directions are defined as directions respectively indicated by the first to third directional axes DR1, DR2, and DR3 and refer to the same reference numerals.

In an embodiment of the inventive concept, the display panel DP is illustrated to include a planar display surface DP-IS, but is not limited thereto. The display panel DP may include a curved display surface or a three-dimensional display surface. The three-dimensional display surface may include a plurality of display regions facing different directions.

FIG. 2 illustrates a planar arrangement relationship of signal lines GL1 to GLn, and DL1 to DLm, and pixels PX11 to PXnm. The signal lines GL1 to GLn, and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a display element. The display panel DP may include additional signal lines according to a configuration of the pixel driving circuits of the pixels PX11 to PXnm.

The pixels PX11 to PXnm are exemplarily illustrated to have a matrix type, but the type thereof is not limited thereto. The pixels PX11 to PXnm may be arranged in a PenTile type. The pixels PX11 to PXnm may be arranged in a diamond type. A gate driving circuit GDC may be integrated into the display panel DP through an oxide silicon gate driver circuit (OSG) process or an amorphous silicon gate driver circuit (ASG) process.

Figure 3A:
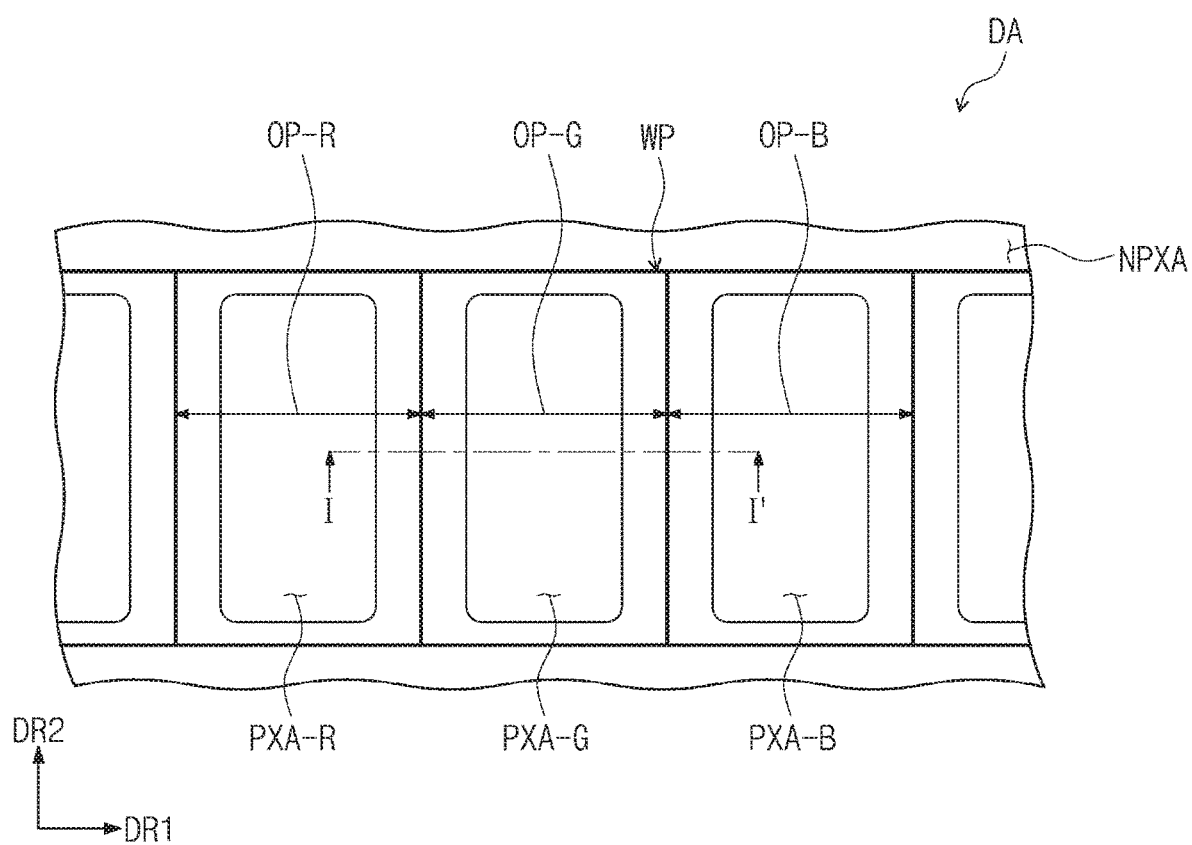
FIG. 3A is a plan view of pixel regions of a display panel according to an embodiment of the inventive concept.
Figure 3B:
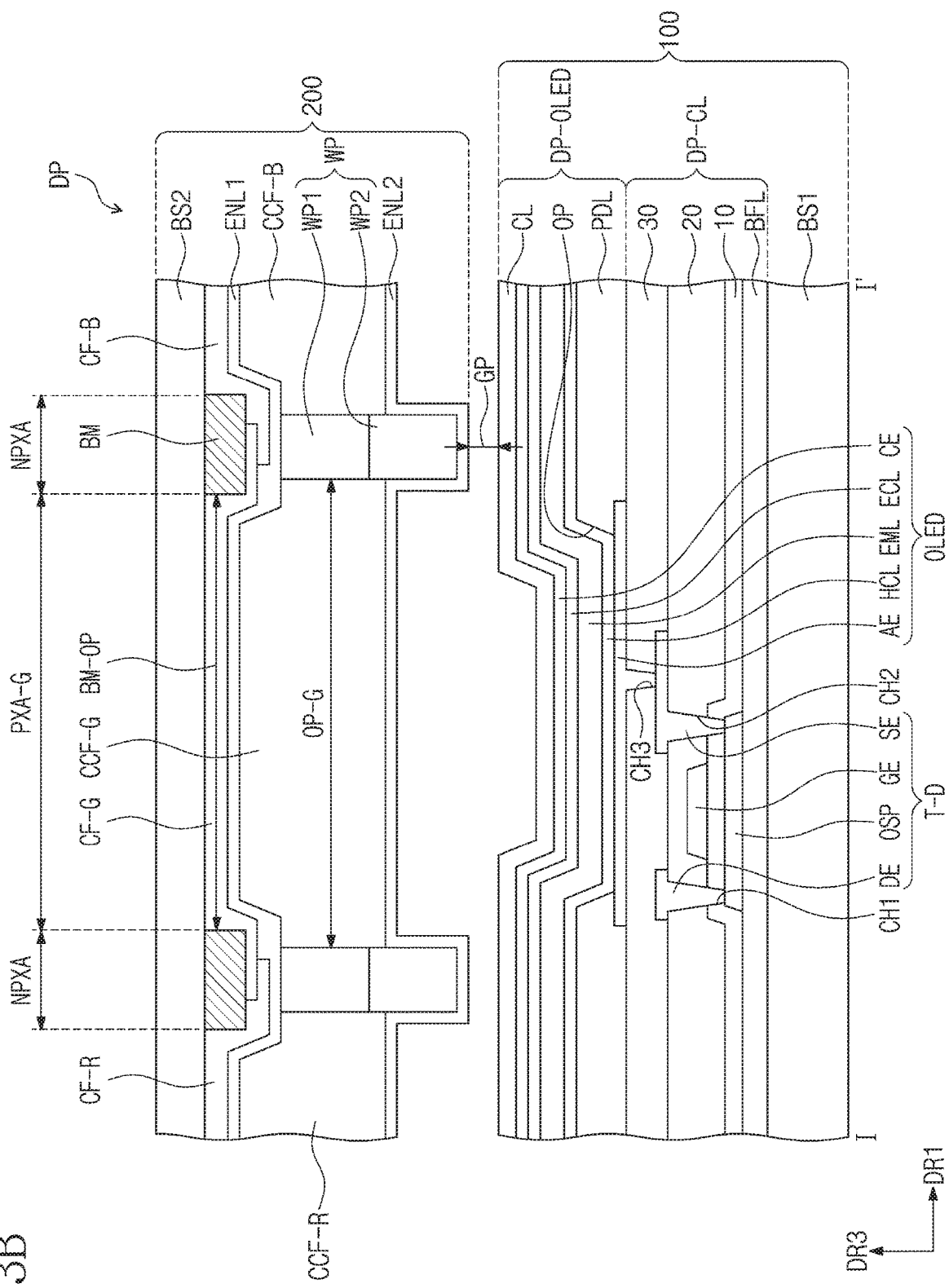
FIG. 3B is a cross-sectional view of a pixel region of a display panel according to an embodiment of the inventive concept.
Figure 3C:
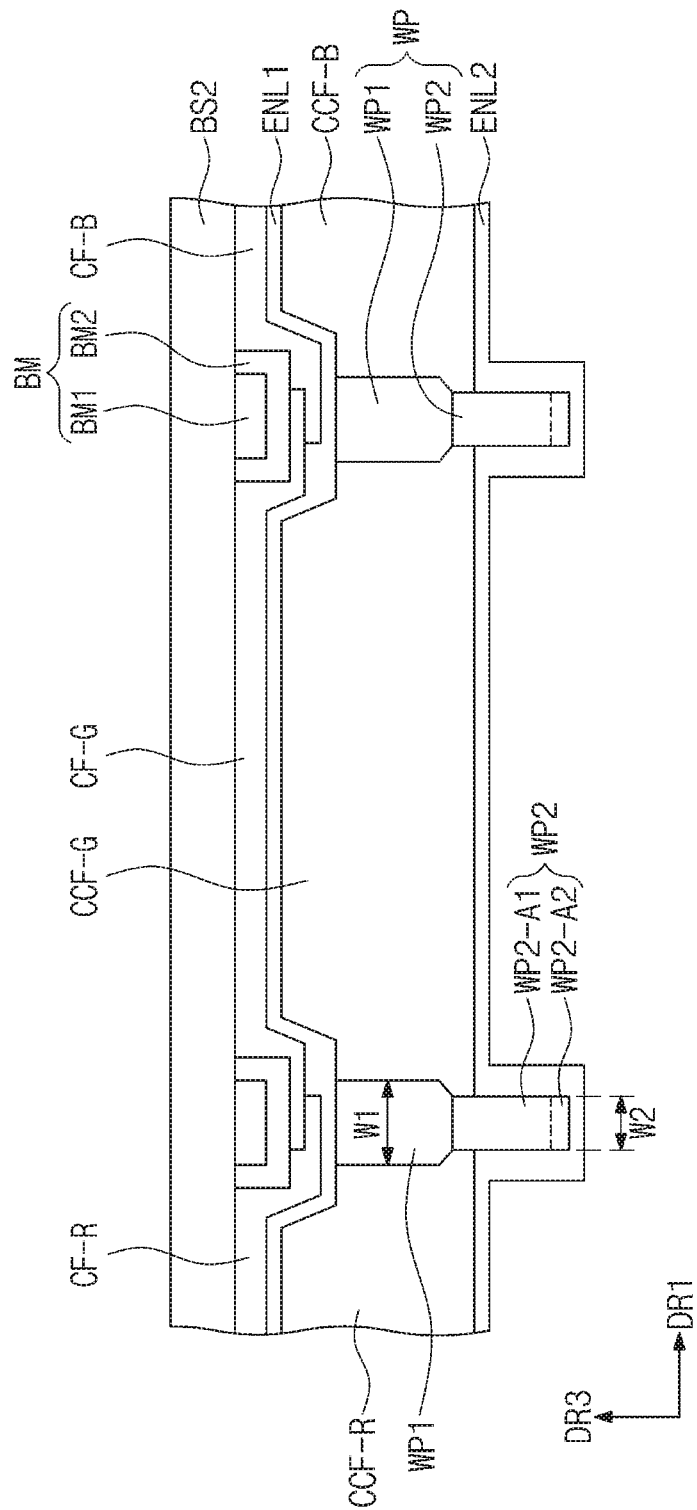
FIG. 3C is a cross-sectional view of a pixel region of an upper display substrate according to an embodiment of the inventive concept.

FIG. 3A is a plan view of pixel regions PXA-R, PXA-G, and PXA-B of the display panel DP according to an embodiment of the inventive concept. FIG. 3B is a cross-sectional view of the pixel region PXA-G of a display panel DP according to an embodiment of the inventive concept. FIG. 3C is a cross-sectional view of the pixel region PXA-G of an upper display substrate 200 according to an embodiment of the inventive concept.

FIG. 3A is an enlarged view of a part of the display area DA illustrated in FIG. 1A. In the drawing, three types of pixel regions PXA-R, PXA-G and PXA-B are mainly illustrated. The three types of pixel regions PXA-R, PXA-G and PXA-B illustrated in FIG. 3A may be repeatedly disposed in the entire display region DA.

A light shielding region or peripheral region NPXA is disposed on the periphery of the first to third pixel regions PXA-R, PXA-G and PXA-B. A light shielding region NPXA may be defined as a peripheral region. The light shielding region NPXA is disposed at the boundaries of the first to third pixel regions PXA-R, PXA-G and PXA-B and prevents color mixture between the first to third pixel regions PXA-R, PXA-G and PXA-B.

In the present embodiment, the first to third pixel regions PXA-R, PXA-G, and PXA-B are illustrated to have the same planar area, but are not limited thereto. The areas of at least two among the first to third pixel regions PXA-R, PXA-G, and PXA-B may be different. The first to third pixel regions PXA-R, PXA-G, and PXA-B are illustrated to have a rectangular shape with round corner regions in a plan view, but are not limited thereto. In a plan view, the first to third pixel regions PXA-R, PXA-G, and PXA-B may have another polygonal shape such as a diamond or pentagon shape.

One among the first to third pixel regions PXA-R, PXA-G, and PXA-B provides first color light corresponding to source light, another provides second color light that is different from the first color light, and the remaining one provides third color light that is different from the first color light and the second color light. In the present embodiment, the first pixel region PXA-R may provide red light, the second pixel region PXA-G may provide green light, and the third pixel region PXA-B may provide blue light.

The partition wall is overlapped with the light shielding region NPXA. First to third partition wall opening parts OP-R, OP-G, and OP-B, which respectively correspond to the first to third pixel regions PXA-R, PXA-G, and PXA-B, are defined in the partition wall.

FIG. 3B illustrates a cross section of the display panel DP corresponding to the second pixel region PXA-G. FIG. 3B exemplarily illustrates cross sections corresponding to a driving transistor T-D and an organic light emitting element OLED. An upper display substrate 200 and a lower display substrate 100 may provide a prescribed gap GP.

As illustrated in FIG. 3B, the lower display substrate 100 includes a first base substrate BS1, a circuit element layer DP-CL disposed on the first base substrate BS1, and a display element layer DP-OLED disposed on the circuit element layer DP-CL.

The first base substrate BS1 may include a synthetic resin substrate or a glass substrate. The circuit element layer DP-CL includes at least one insulation layer and a circuit element. The circuit element includes signal lines and a driving circuit of a pixel, etc. The circuit element layer DP-CL may be formed through a process of providing an insulation layer, a semiconductor layer and a conduction layer by coating, deposition, and the like, and a process of patterning the insulation layer, the semiconductor layer and the conduction layer through a photolithography process.

In the present embodiment, the circuit element layer DP-CL may include a buffer layer BFL, a first insulation layer 10, a second insulation layer 20, and a third insulation layer 30. The first insulation layer 10 and the second insulation layer 20 may be inorganic layers, and the third insulation layer 30 may be an organic layer.

FIG. 3B exemplarily illustrates an arrangement relationship between a semiconductor pattern OSP, a control electrode GE, an input electrode DE, and an output electrode SE that compose the driving transistor T-D. First to third through-holes CH1, CH2, and CH3 are also illustrated as an example.

The display element layer DP-OLED includes a light emitting element OLED. The light emitting element OLED may generate the above-described source light. The light emitting element OLED includes a first electrode, a second electrode, and an emission layer interposed therebetween. In the present embodiment, the display element layer DP-OLED may include an organic light emitting diode as the light emitting element. The display element layer DP-OLED includes a pixel definition layer PDL. For example, the pixel definition layer PDL may be an organic layer.

A first electrode AE is disposed on the third insulation layer 30. The first electrode AE is connected to the output electrode SE through the third through-hole CH3 configured to penetrate through the third insulation layer 30. An opening part OP is defined in the pixel definition layer PDL. The opening part OP of the pixel definition layer PDL exposes at least a part of the first electrode AE.

A hole control layer HCL, an emission layer EML, and an electron control layer ECL may be commonly disposed in the pixel region PXA-G and the light shielding region NPXA. The hole control layer HCL, the emission layer EML, and the electron control layer ECL may be commonly disposed in the first to third pixel regions PXA-R, PXA-G, and PXA-B (see FIG. 3A).

The hole control layer HCL may include a hole transport layer, and further include a hole injection layer. The emission layer EML may generate blue light. The blue light may include a wavelength of 410 nm to 480 nm. An emission spectrum of the blue light may have the maximum peak within 440 nm to 460 nm. An electron control layer ECL may include an electron transport layer, and further include an electron injection layer.

A second electrode CE is disposed on the electron control layer ECL. The second electrode CE may be commonly disposed in the first to third pixel regions PXA-R, PXA-G, and PXA-B. Accordingly, the second electrode CE has a larger area than the first electrode AE. A cover layer CL configured to protect the second electrode CE may be further disposed on the second electrode CE. The cover layer CL may include an organic material or an inorganic material.

The lower display substrate 100 may include first, second, and third display elements respectively corresponding to the first to third pixel regions PXA-R, PXA-G, and PXA-B as shown in FIG. 3A. Laminated structures of the first, second and third display elements may be identical to each other, and have the laminated structure of the light emitting element OLED shown in FIG. 3B. However, the laminated structures of the first, second and third display elements may be different from each other, for example, emission layers EML in the first, second and third display elements may emit different colors of light.

As shown in FIG. 3B, the upper display substrate 200 may include a second base substrate BS2, a light shielding pattern BM disposed on the bottom surface of the second base substrate BS2, a color filter CF-G, a partition wall WP, and a color control layer CCF-G.

The second base substrate BS2 may include a synthetic resin substrate or a glass substrate. The light shielding pattern BM is disposed on the bottom surface of the second base substrate BS2. The light shielding pattern BM is disposed in the light shielding region NPXA. Opening parts BM-OP respectively corresponding to the first to third pixel regions PXA-R, PXA-G, and PAX-B are defined in the light shielding pattern BM. In the present embodiment, the pixel region PXA-G is defined to correspond to the opening part BM-OP of the light shielding pattern BM.

A color filter CF-G is disposed on the bottom surface of the base substrate BS2 on the light shielding pattern BM. The color filter CF-G includes a base resin and a dye and/or a pigment dispersed in the base resin. The base resin is a material in which the dye and/or the pigment is dispersed, and may be composed of various resin compositions that are typically referred to as a binder. The color filter CF-G is overlapped on the pixel region PXA-G. An edge region of the color filter CF-G may be overlapped with the light shielding region NPXA. A part of the light shielding pattern BM may be disposed between the color filter CF-G and the bottom surface of the base substrate BS2.

In relation to FIGS. 3A and 3B, first to third color filters CF-R, CF-G, and CF-B are disposed to respectively correspond to the first to third pixel regions PXA-R, PXA-G, and PXA-B. The first to third color filters CF-R, CF-G, and CF-B include dyes and/or pigments configured to absorb light of different wavelength bands. The first color filter CF-R may be a red color filter, the second color filter CF-G may be a green color filter, and the third color filter CF-B may be a blue color filter.

The first to third color filters lower a reflection ratio of external light. Each of the first to third color filters transmits light in a specific wavelength range, and absorbs or cut off light having a wavelength other than the specific wavelength band. Each of the first to third color filters may absorb light having a wavelength other than the specific wavelength range.

A first encapsulation layer ENL1 is disposed on the color filter CF-G. The first encapsulation layer ENL1 encapsulates the color filter CF-G. The first encapsulation layer ENL1 may be commonly disposed in the first to third pixel regions PXA-R, PXA-G, and PXA-B.

The first encapsulation layer ENL1 may include an inorganic layer. The first encapsulation layer ENL1 may include any one among silicon oxide, silicon nitride, and silicon oxynitride. The first encapsulation layer ENL1 may further include an organic layer configured to form a flat bottom surface.

A partition wall WP is disposed on the bottom surface of the first encapsulation layer ENL1. The partition wall WP may be completely overlapped with the light shielding pattern BM disposed on the light shielding region NPXA. The partition wall WP defines first to third inside regions (or inside spaces) respectively corresponding to the first to third pixel regions PXA-R, PXA-G, and
PXA-B in FIG. 3A.

The partition wall WP prevents the color control layers CCF-R, CCF-G and CCF-B from being mixed between the first to third pixel regions PXA-R, PXA-G, and PXA-B in FIG. 3A when forming the color control layers CCF-R, CCF-G and CCF-B.

The color control layer CCF-G is disposed inside the partition wall WP. In the present embodiment, the color control layer CCF-G may absorb first color light generated by the light emitting element OLED and then generate other color light. The color control layer CCF-G may transmit or/and scatter the first color light.

The color control layer CCF-G may include a base resin and quantum dots mixed with (or dispersed in) the base resin. In the present embodiment, the color control layer CCF-G may be defined as a quantum dot layer. The base resin is a material or medium in which the quantum dots are dispersed, and may include various resins that are typically referred to as a binder. However, the base resin herein is not limited thereto, and, in the present specification, a material in which the quantum dots may be dispersed uniformly may be referred to as the base resin regardless of a name thereof, an additional other function, a material, or the like. The base resin may be a polymer resin. For example, the base resin may be an acrylic resin, a urethane-based resin, a silicone-based resin, an epoxy-based resin, or the like.

The base resin may be a transparent resin.

The quantum dot may be a particle configured to convert a wavelength of incident light. The quantum dot is a material having a crystalline structure of several nanometers in size, is composed of several hundreds to thousands of atoms, and exhibits, due to its small size, a quantum confinement effect in which an energy band gap increases. When light having a wavelength of higher energy than a band gap is incident to the quantum dot, the quantum dot absorbs the light to become an excited state, and drops to the ground state while emitting light of a specific wavelength. The emitted light of the specific wavelength has a value corresponding to the band gap. When the size and composition of the quantum dot are adjusted, emission characteristics may be adjusted due to the quantum confinement effect.

The quantum dot may be selected from among a Group II-VI compound, a Group III-V compound, a Group IV-VI compound, a Group IV element, a Group IV compound, and a combination thereof.

The Group II-VI compound may include one selected from a group consisting of: a binary compound selected from a group consisting of CdSe, CdTe, CdS, ZnS, ZnSe, ZnTe, ZnO, HgS, HgSe, HgTe, MgSe, MgS, and a mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; and a combination thereof.

The Group I-III-VI compound one selected from a group consisting of: a ternary compound selected from the group consisting of AgInS2, CuInS2, AgGaS2, CuGaS2, and mixtures thereof; a quaternary compound selected from a group consisting of AgInGaS2, CuInGaS2.

The Group III-V compound includes one selected from a group consisting of: a binary compound selected from a group consisting of GaN, GaP, GaAs, GaSb, AN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; or a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; and a combination thereof. Meanwhile, the Group III-V compound may further include a Group II metal. For example, InZnP or the like may be selected as the Group III-II-V compound.

The Group IV-VI compound includes one selected from a group consisting of: a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; or a quaternary compound selected from a group consisting of SnPbSSe, SnPbSeTe, SnPbSTe; and a mixture thereof, and a combination thereof. The Group IV element may be selected from a group consisting of Si, Ge, and a mixture thereof. The Group IV compound may be a binary compound selected from a group consisting of SiC, SiGe, and a mixture thereof.

Here, the binary compound, the ternary compound, or the quaternary compound may exist inside a particle with a uniform concentration, or exist inside an identical particle with a concentration distribution being divided into partially different states.

The quantum dot may have a core-shell structure including a core and a shell surrounding the core. In addition, a core-shell structure may be possible in which one quantum dot surrounds another quantum dot. The interface between the core and the shell may have a concentration gradient in which the concentration of elements presented in the shell decreases toward the core.

The quantum dot may be a particle having the nanometer scale in size. The quantum dot may have a full width of half maximum (FWHM) of an emission wavelength spectrum of about 45 nm or shorter, preferably about 40 nm or shorter, more preferably about 30 nm or shorter, and in this range, the color purity or color gamut may be improved. In addition, light emitted through such a quantum dot is ejected omnidirectionally, and thus the viewing angle may be improved.

In addition, the type of the quantum dot is not particularly limited to one typically used in the technical field, but, more specifically, the type of a spherical, pyramidal, multi-arm, or cubic nanoparticle, a nanotube, a nanowire, a nanofiber, a nano-planar particle, or the like may be used.

In relation to FIGS. 3A and 3B, first to third color control layers are disposed so as to correspond to the first to third pixel regions PXA-R, PXA-G and PXA-B. The first color control layer CCF-R absorbs blue light to generate red light, and the second color control layer CCF-G absorbs blue light to generate green light. In other words, the first color control layer CCF-R and the second color control layer CCF-G may include different quantum dots from each other. The third color control layer CCF-B may transmit blue light.

The first to third color control layers CCF-R, CCF-G, and CCF-B may further include a scattering particle. The scattering particle may be a titanium oxide (TiO2), a silica-based nanoparticle, or the like.

A second encapsulation layer ENL2 is disposed on the partition wall WP and the color control layer CCF-G. The second encapsulation layer ENL2 encapsulates the partition wall and the color control layer CCF-G. The second encapsulation layer ENL2 may be commonly disposed in the first to third pixel regions PXA-R, PXA-G, and PXA-B (see FIG. 3A).

The second encapsulation layer ENL2 may include an inorganic layer configured to contact the partition wall WP and the color control layer CCF-G. The inorganic layer may include any one among silicon oxide, silicon nitride, and silicon oxynitride. The second encapsulation layer ENL2 may further include an organic layer disposed on the inorganic layer. The organic layer may form a flat bottom surface. The first encapsulation layer ENL1 may include silicon oxide, and the second encapsulation layer ENL2 may include silicon nitride.

The color control layer CCF-G shown in FIG. 3B includes a base resin and quantum dots, and the weight % of the quantum dots over the entire color control layer CCF-G is smaller than a reference value. When the weight % of the quantum dots is larger than the reference value, the bonding force of the color control layer CCF-G to the partition wall and the first encapsulation layer ENL1 is reduced to cause a defect.

In order to increase optical-to-electrical conversion efficiency, the weight of the quantum dots should be larger than a reference weight. The weight of the quantum dots may be adjusted to be larger than the reference weight by increasing the thickness of the color control layer CCF-G. In the present embodiment, the thickness of the color control layer CCF-G may be 15 μm or larger. An upper limit value of the thickness of the color control layer CCF-G is not particularly limited, but is formed to have a height lower than that of the partition wall WP.

The height of the partition wall WP may be higher than that of each of the first to third color control layers CCF-R, CCF-G, and CCF-B. The height of the color control layer CCF-G and the height of the partition wall WP are values measured in the third direction DR3. The partition wall WP prevents different compositions from being mixed when forming the first to third pixel regions PXA-R, PXA-G and PXA-B (see FIG. 3A).

The partition wall WP may include two layers. A first layer WP1 may be directly disposed on the first encapsulation layer ENL1. A second layer WP2 may be directly disposed on the first layer WP1. The first layer WP1 and the second layer WP2 are formed through different processes and thus have the boundary. A part of the second layer WP2 protrudes downwards from the first, second and third color control layers CCF-R, CCF-G and CCF-B in a cross sectional view.

The first layer WP1 and the second layer WP2 may have different materials. The first layer WP1 and the second layer WP2 may commonly include a base resin, a coupling agent and a photoinitiator. The base resin may include various resins that may be typically referred to as a binder. The first layer WP1 and the second layer WP2 may further include a dispersant. The second layer WP2 may further include a black coloring agent. The black coloring agent may include a black dye or a black pigment. The black coloring agent may include carbon black, a metal such as chromium, or an oxide thereof.

The first layer WP1 may not include the black coloring agent, or may include a black coloring agent having a smaller weight % than the second layer WP2. Accordingly, the optical density of the second layer WP2 may have a value larger than or equal to that of the first layer WP1. In the present embodiment, the optical density of the second layer WP2 may be from about 0.15 to about 0.5 when a thickness of the second layer WP2 is 1 μm. The second layer WP2 may prevent first color light generated in the light emitting element OLED from being incident onto the adjacent pixel regions PXA-R and PXA-B (see FIG. 3).

Each of the first layer WP1 and the second layer WP2 may be formed through an exposure process and a development process. The partition wall WP which totally has the optical density of from about 0.2 to about 0.5 has a low transmissivity, and accordingly, when the thickness of the partition wall WP is thicker than a reference value, exposure efficiency of light become lowered. In a process of fabricating the partition wall WP composed of only the second layer WP2 having a thickness thicker than the reference value, a region adjacent to the first encapsulation layer ENL1 may be under exposed to cause a defect.

In the present embodiment, the thickness of the second layer WP2 may be from about 5 μm to about 10 μm so that the exposure is sufficiently performed. The thickness of the first layer WP1 may be from about 5 μm to about 15 μm.

Because the first layer WP1 has a lower optical density, the exposure efficiency of the first layer WP1 is high. Moreover, the exposure may be performed twice when forming the partition wall WP, a defect in the partition wall WP may be reduced.

In relation to FIG. 3C, the light shielding pattern BM may include a first light shielding layer BM1 and a second light shielding layer BM2. The first light shielding layer BM1 may be directly formed on the bottom surface of the second base substrate BS2. The first light shielding layer BM1 may include the same material as a blue color filter.

The second light shielding layer BM2 may cover at least the bottom surface of the first light shielding layer BM1. As shown in FIG. 3C, the second light shielding layer BM2 may further cover the side surfaces of the first light shielding layer BM1.

The second light shielding layer BM2 may be a typical black matrix. The second light shielding layer BM2 has a black color. The second light shielding layer BM2 may include a base resin and a black coloring agent mixed therewith. The optical density of the second light shielding layer BM2 may be from about 1 to about 3 when a thickness of the second light shielding layer BM2 is 1 μm.

The first light shielding layer BM1 having the same material as the blue color filter may lower the reflectance of external light, because the difference in refraction index between the first light shielding layer BM1 and the second base substrate BS2 is smaller than that between the second light shielding layer BM2 and the second base substrate BS2.

With reference FIG. 3C, the first layer WP1 has a smaller width than the light shielding pattern BM. The width W1 of the first layer WP1 may be from about 10 μm to about 15 μm. The width of the second layer WP2 may be smaller than that W1 of the first layer WP1. The width W2 of the second layer WP2 and the width W1 of the first layer WP1 are measured in the second direction DR2. The second layer WP2 may be completely overlapped with the first layer WP 1in a plan view. The first layer WP1 may be completely overlapped with the light shielding pattern BM in a plan view.

However, the embodiment of the inventive concept is not limited the above described numerical range. The width of the light shielding region NPXA may be differently set depending on the resolution of a display panel, and the width W1 of the first layer WP1 may be wider or narrower than the above-described range.

The corner regions of the first layer WP1 are partially removed by a developer, and thus the corners may not be substantially defined in the first layer WP1. FIG. 3C shows the corner regions of the first layer WP1 described above. The corners may not be substantially formed in the first layer WP1 on the cross section. A chamfer is placed in the first layer WP1.

In relation to FIG. 3C, the second layer WP2 may include two regions having different properties on the cross section. The second layer WP2 may include a hydrophilic region WP2-A1 and a hydrophobic region WP2-A2.

The hydrophobic region WP2-A2 is disposed further away from the first layer WP1 than the hydrophilic region WP2-A1. The hydrophilic region WP2-A1 is disposed between the hydrophobic region WP2-A2 and the first layer WP1. The hydrophobic region WP2-A2 prevents the different color control layers CCF-R, CCF-G and CCF-B from being mixed at boundaries between the first to third pixel regions PXA-R, PXA-G and PXA-B (see FIG. 3A).

The thickness of the second layer WP2, which includes the hydrophilic region WP2-A1 and the hydrophobic region WP2-A2, may be from about 7 μm to about 10 μm. The hydrophilic region WP2-A1 may include a base resin and a black coloring agent mixed with the base resin. The hydrophobic region WP2-A2 may include a base resin and a hydrophobic agent chemically-boned to the base resin. The hydrophobic agent is phase-separated in the process for providing the second layer WP2, and then densely concentrated on the top surface of the second layer WP2. The thickness of the hydrophobic region WP2-A2 may be from about 30 nm to about 200 nm.

The hydrophobic agents may include a fluorine-based epoxy series material and a perfluoroether series system material. A hydrophobic agent of product name S-656, S-611, S-386, or S-243 of Asahi Kasei Corporation, product name RS-56 or RS-76NS of DIC corporation, product name DAC-HP of Daikin industries, or product name FS-7024 of Fluorotech corporation may be used to form the partition wall.

Figure 4:
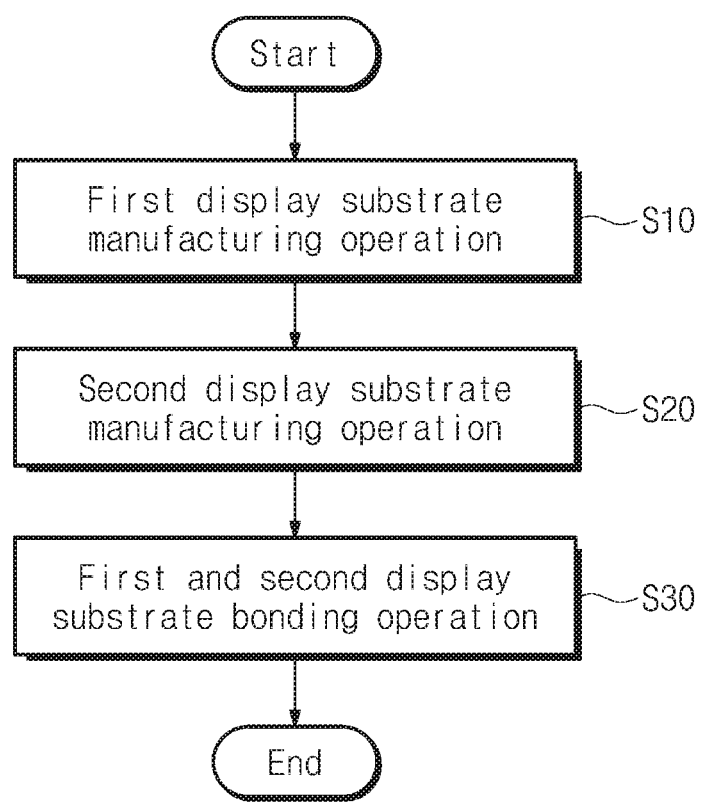
FIG. 4 is a flowchart illustrating a fabrication method of a display panel according to an embodiment of the inventive concept.

FIG. 4 is a flowchart illustrating a fabrication method of a display panel DP according to an embodiment of the inventive concept. FIGS. 5A to 5E illustrate a fabrication method of an upper display substrate 200 according to an embodiment of the inventive concept. Hereinafter, detailed descriptions about the same components as those described with reference to FIGS. 1 to 3C will be omitted.

As shown in FIG. 4, a first display substrate, which includes first to third display elements, is fabricated (operation S10). The first display substrate may be the lower display substrate 100 described with reference to FIGS. 1 A to 5, namely, an array substrate. The first display substrate may be fabricated according to a typical fabrication method.

In addition, a second display substrate is fabricated (operation S20). The fabrication sequence of the first display substrate and the second display substrate is not particularly limited.

Then, the first display substrate and the second display substrate are bonded (operation S30). A preliminary sealant is formed in the non-display region NDA (see FIG. 1A) on one of the first display substrate and the second substrate, and then the first display substrate may be bonded with the second display substrate. After the bonding, the preliminary sealant may be cured.

The fabrication method of the second display substrate 200 will be described in more detail with reference to FIGS. 5A to 5E. FIGS. 5A to 5E illustrate cross sections corresponding to the drawing in FIG. 3C.

Figure 5A:
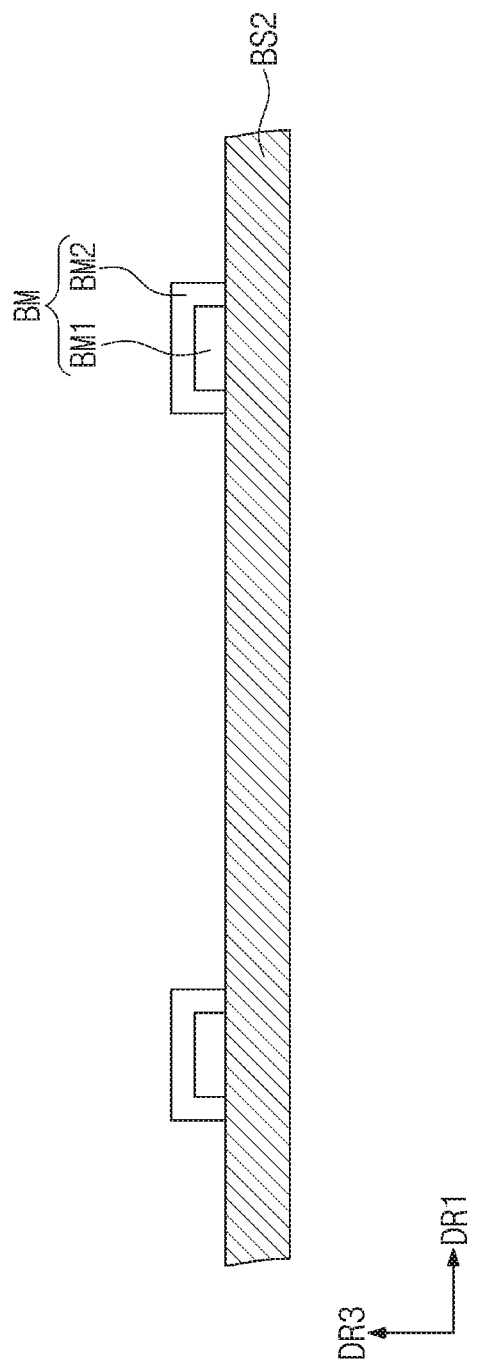

As illustrated in FIG. 5A, the light shielding pattern BM is formed on the base substrate BS2. In the present embodiment, the light shielding pattern BM may be formed by printing an inorganic material of a specific color on a certain region of the base substrate BS2. In an embodiment of the inventive concept, an organic layer of a specific color is formed on one surface of the base substrate BS2, and then the organic layer is exposed and developed to form the first light shielding layer BM1.

After the first light shielding layer BM1 is formed, the second light shielding layer BM2 may be formed so as to form a light shielding pattern BM having a two-layered structure. The second preliminary partition wall layer may be formed, and then exposed and developed to form the second light shielding layer BM2.

Figure 5B:
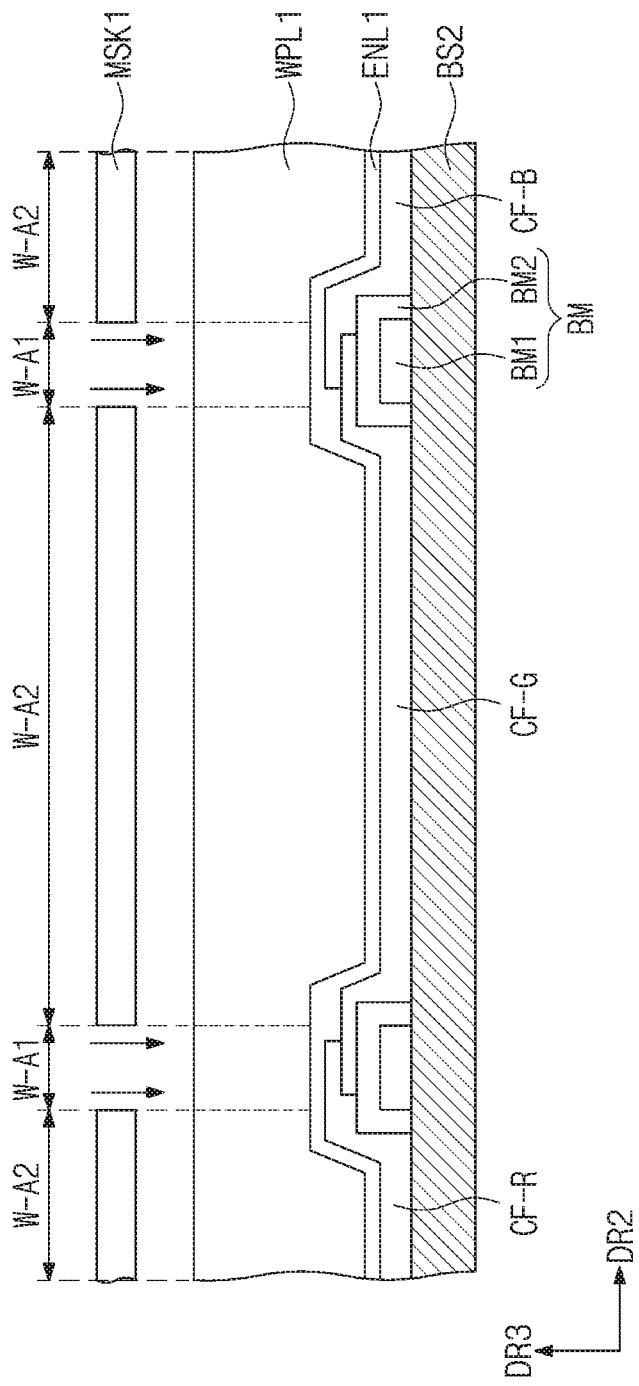

As shown in FIG. 5B, the color filters CF-R, CG-G and CF-B are formed on the base substrate BS2. In the present embodiment of the inventive concept, the organic layer having a prescribed color is formed on one surface of the base substrate BS2, and then the organic layer is exposed and developed to form the color filters CF-R, CG-G and CF-B. In order to form three kinds of color filters, the 1-cycle process of forming an organic layer, exposing and developing the organic layer may be performed three times.

As shown in FIG. 5B, the first encapsulation layer ENL1 is formed on the color filters CF-R, CG-G and CF-B. Inorganic material is deposited to form the first encapsulation layer ENL1.

As shown in FIG. 5B, the first preliminary partition wall layer WPL1 is formed on the first encapsulation layer ENL1. A first composition may be coated to form a first preliminary partition wall layer WPL1. The first composition may include a base resin, a coupling agent, and a photoinitiator. The first composition may further include a black coloring agent. The first composition may further include a dispersant.

As shown in FIG. 5B, the first preliminary partition wall layer WPL1 may be exposed so that the first region W-A1, which is overlapped with the light shielding pattern BM, is exposed to light. Because the first preliminary partition wall layer WPL1 exposed to the light is not developed and other portions of the first preliminary partition wall layer WPL1 are developed, the second region W-A2 may be surrounded by the first region W-A1. The first preliminary partition wall layer WPL1 may be exposed using a first mask MSK1 formed with an open region corresponding to the first region W-A1.

Before exposure, the base substrate BS2 with the first preliminary partition wall layer WPL1 formed thereon is disposed in a vacuum chamber to dry the first preliminary partition wall layer WPL1. The dried first preliminary partition wall layer WPL1 may be baked at a first temperature. The first temperature may be from about 90° C. to about 130° C. Then the above-described exposure process may be performed.

Figure 5C:
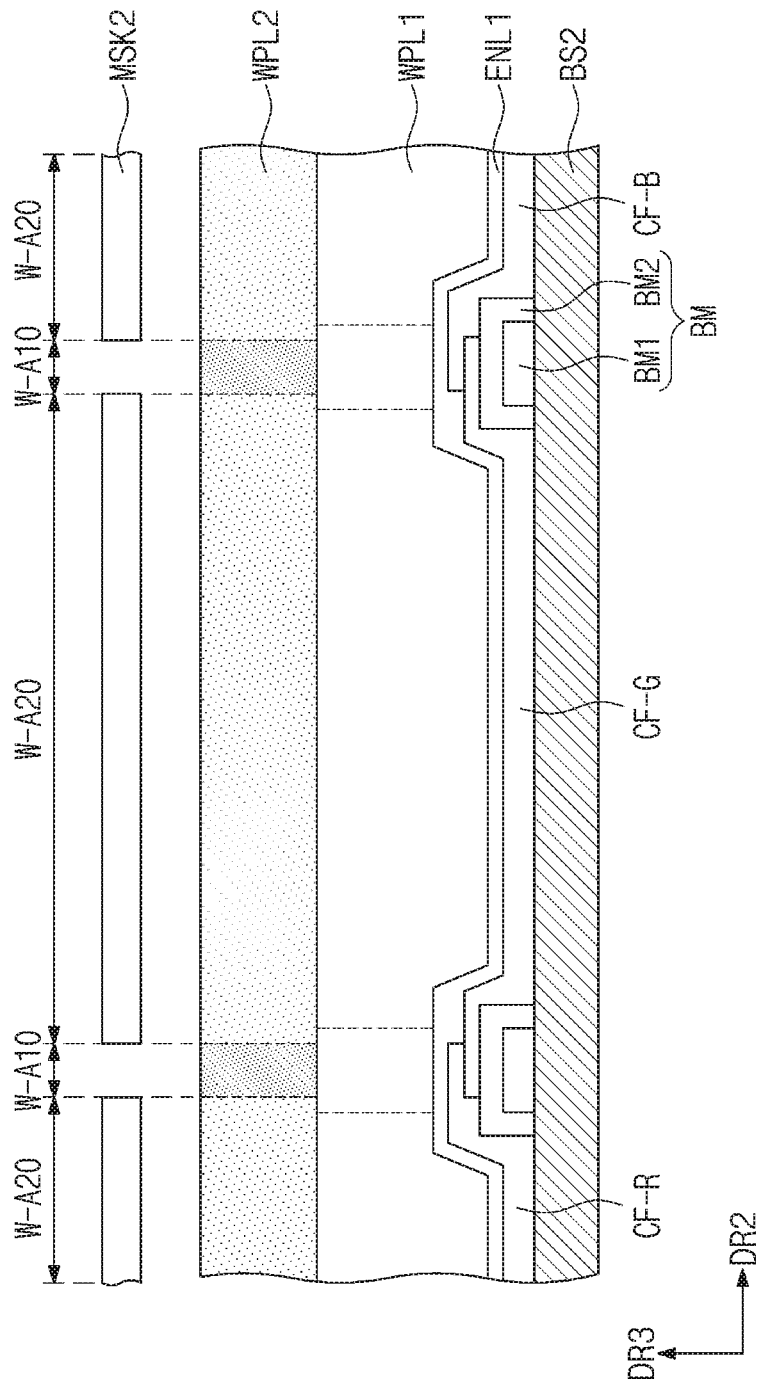

As shown in FIG. 5C, a second preliminary partition wall layer WPL2 is formed on the exposed first preliminary partition wall layer WPL1. The second preliminary partition wall layer WPL2 may be formed by coating with the second composition. The second composition may include a base resin, a coupling agent, or a photoinitiator. The second composition may further include a black coloring agent. The second composition may further include a dispersant. The weight % of the black coloring agent of the second composition may be larger than that of the first composition.

As shown in FIG. 5C, the second preliminary partition wall layer WPL1 may be exposed so that a third region W-A10, which is overlapped with the first region W-A1 of the first preliminary partition wall layer WPL1, is exposed to light. Because the second preliminary partition wall layer WPL2 exposed to the light is not developed, the third region W-A10 may surround the fourth region W-A20 disposed to be overlapped with the second region W-A2. The second preliminary partition wall layer WPL2 may be exposed using a second mask MSK2 formed with an open region corresponding to the third region W-A10.

The first layer WP1 may be prevented from being misaligned with the second layer WP2, which is caused by a process error, using the second mask MSK2 including the third region W-A10 having the smaller width than the first region W-A 1. In other words, the second layer WP2 may be completely overlapped with the first layer WP1 in a plan view.

In an embodiment of the inventive concept, the first mask MSK1, instead of the second mask MSK2, may be used to expose the second preliminary partition wall layer WPL2.

Before the exposure, the base substrate BS2 with the second preliminary partition wall layer WPL2 formed thereon may be disposed in the vacuum chamber to dry the second preliminary partition wall layer WPL2. The dried second preliminary partition wall layer WPL2 may be baked at a second temperature. The second temperature may be set higher than the first temperature. The second temperature may be from about 100° C. to about 140° C. Then, the above-described exposure process may be performed.

Although not illustrated in detail in FIG. 5C, the third region W-A10 may include a hydrophilic region WP2-A1 (see FIG. 3C) and the hydrophobic region WP2-A2 (see FIG. 3C) disposed on the hydrophilic region WP2-A1 in the third direction DR3. The above-described second composition may further include a hydrophobic agent. The phase separation occurs after the second preliminary partition wall layer WPL2 is coated. The hydrophobic agent is separated from the hydrophilic material and moves towards the top surface of the second preliminary partition wall layer WPL2. Such phase separation is accelerated by the baking process at the second temperature.

In order to form the hydrophobic region WP2-A2 of from about 30 nm to about 200 nm in thickness, the second preliminary partition wall layer WPL2 having about 7 μm or higher thickness is formed. Maximum weight % of the hydrophobic agent is limited due to an adverse effect of the hydrophobic agent that may be increased according to an increase in hydrophobic agent. Therefore, in order to increase the hydrophobic agent included in the entire second preliminary partition wall layer WPL2, the second preliminary partition wall layer WPL2 is formed to have a thickness equal to or greater than a prescribed thickness.

A polymer of the second composition and a monomer are polymerized in the exposure process, and the hydrophobic agent may also be chemically bonded with the polymer and/or monomer. In this way, the hydrophobic region is formed in a region adjacent to the top surface of the third region W-A10.

As shown in FIG. 5D, the first preliminary partition wall layer WPL1 and the second preliminary partition wall layer WPL2 may be developed so as to remove the second region W-A2 and the fourth region W-A20. The second region W-A2 and the fourth region W-A20, which have the same base material, may be developed in one-time development process by using the same developer.

After the development process, the partition wall WP may be baked at a third temperature. The third temperature may be from about 200° C. to about 250° C. The partition wall WP is baked at a high temperature so as to increase the intensity thereof.

With reference FIGS. 5A to 5D, because the second preliminary partition wall layer WPL2 is formed and then exposed before the first preliminary partition wall layer WPL1 is developed and the first region W-A1 overlapped with the third region W-A10 may have a substantially flat surface.

Figure 5E:
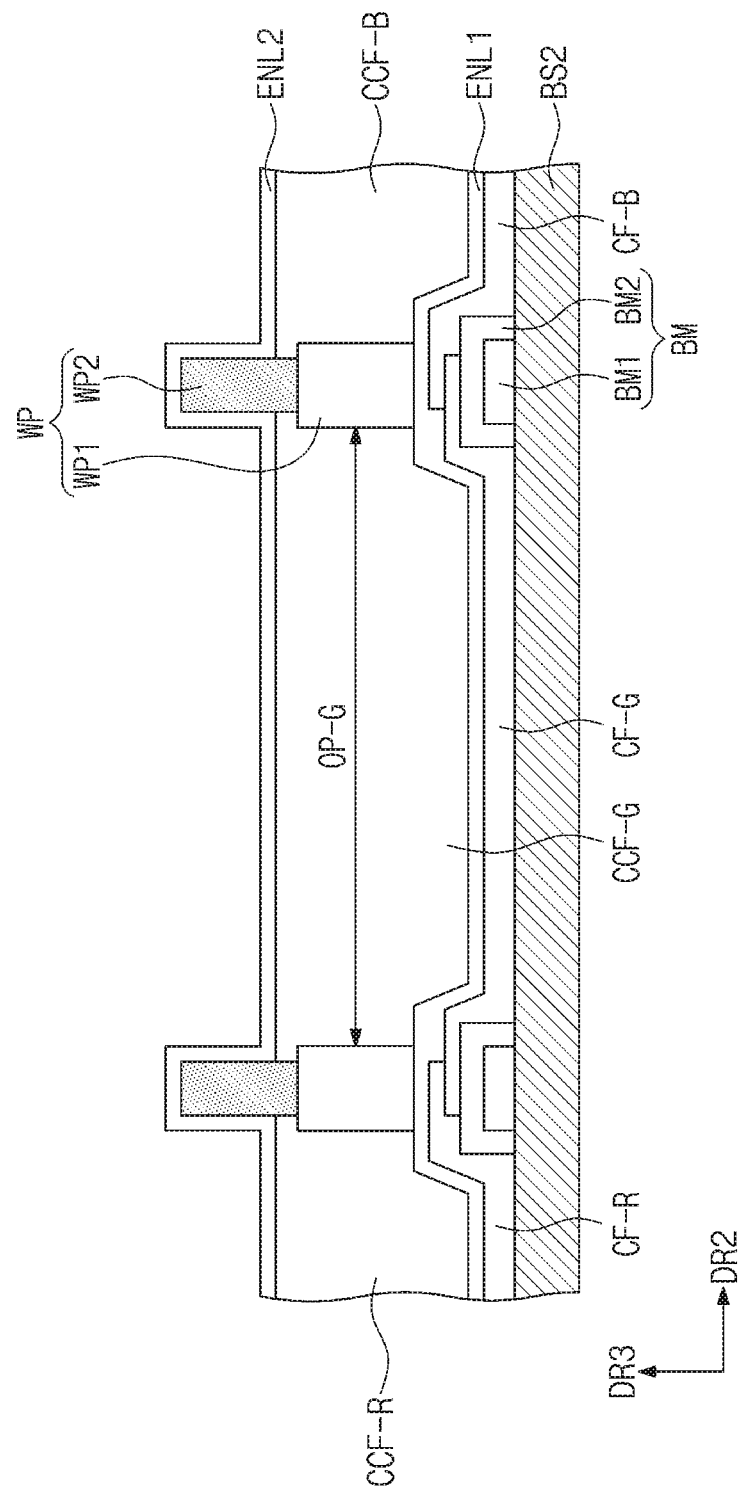

As illustrated in FIG. 5E, the color control layers CCF-R, CCF-G and CCF-B are formed inside the partition wall opening part OP-G. The color control layers CCF-R, CCF-G and CCF-B are sequentially formed so as to correspond to the first, second, and third partition wall opening parts OP-R, OP-G and OP-B, which are illustrated in FIG. 3A, and, hereinafter, a method of manufacturing one color control layer CCF-G will be described. A composition (hereinafter, color composition) is formed for constituting the color control layer CCF-G inside the partition wall opening part OP-G.

The color composition may be formed inside the partition wall opening part OP-G using an inkjet process. The hydrophobic region WP2-A2 (see FIG. 3C) formed on the top surface of the partition wall WP prevents the color composition from being formed on the partition wall WP, thereby the color composition is formed only in the partition wall opening part OP-G.

The color composition includes a base resin and a quantum dot. The base resin may include an epoxy-based polymer and/or a monomer. The color composition may further include a scattering particle. The color composition is dried in a vacuum state. Then, a first baking process and a second baking process are performed.

A first baking temperature may be from about 90° C. to about 130° C. The second baking temperature may be from about 180° C. to about 240° C. The color control layer may be uniformly dried through the two-step baking process.

Then, the second encapsulation layer ENL2 is formed on the color control layer CCF-R, CCF-G and CCF-B. An inorganic material is deposited to form an encapsulation inorganic layer. An organic material may be deposited or coated to form an encapsulation organic layer.

Although not shown separately, at least one of processes to form the color filter CF-G, the first encapsulation layer ENL1 and the second encapsulation layer ENL2 may be omitted.

Figure 6A:
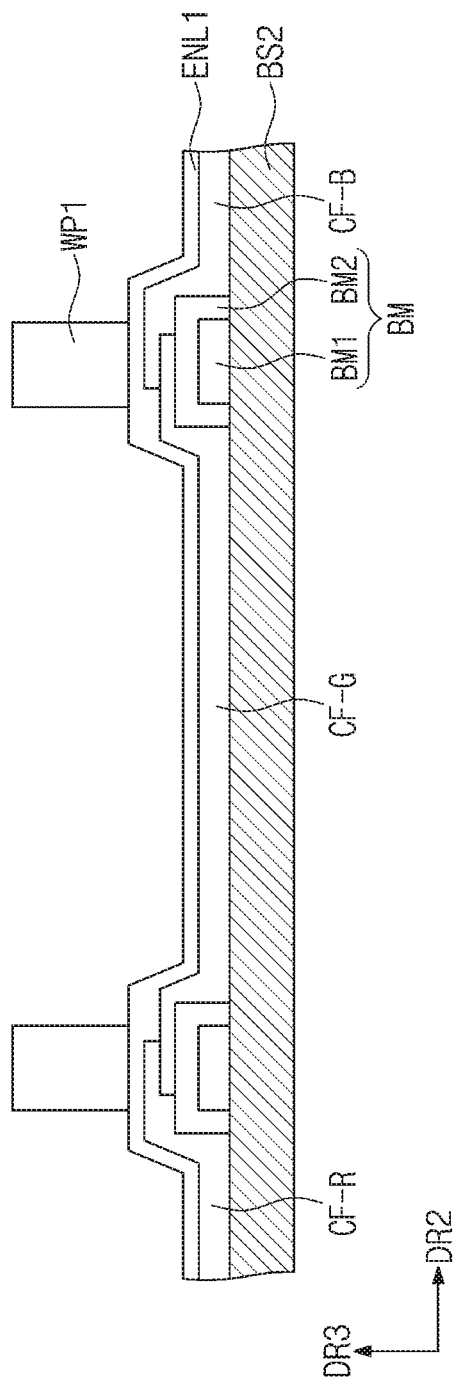
FIGS. 6A and 6B are drawings illustrating a fabrication method of an upper display substrate according to an embodiment of the inventive concept.
Figure 6B:
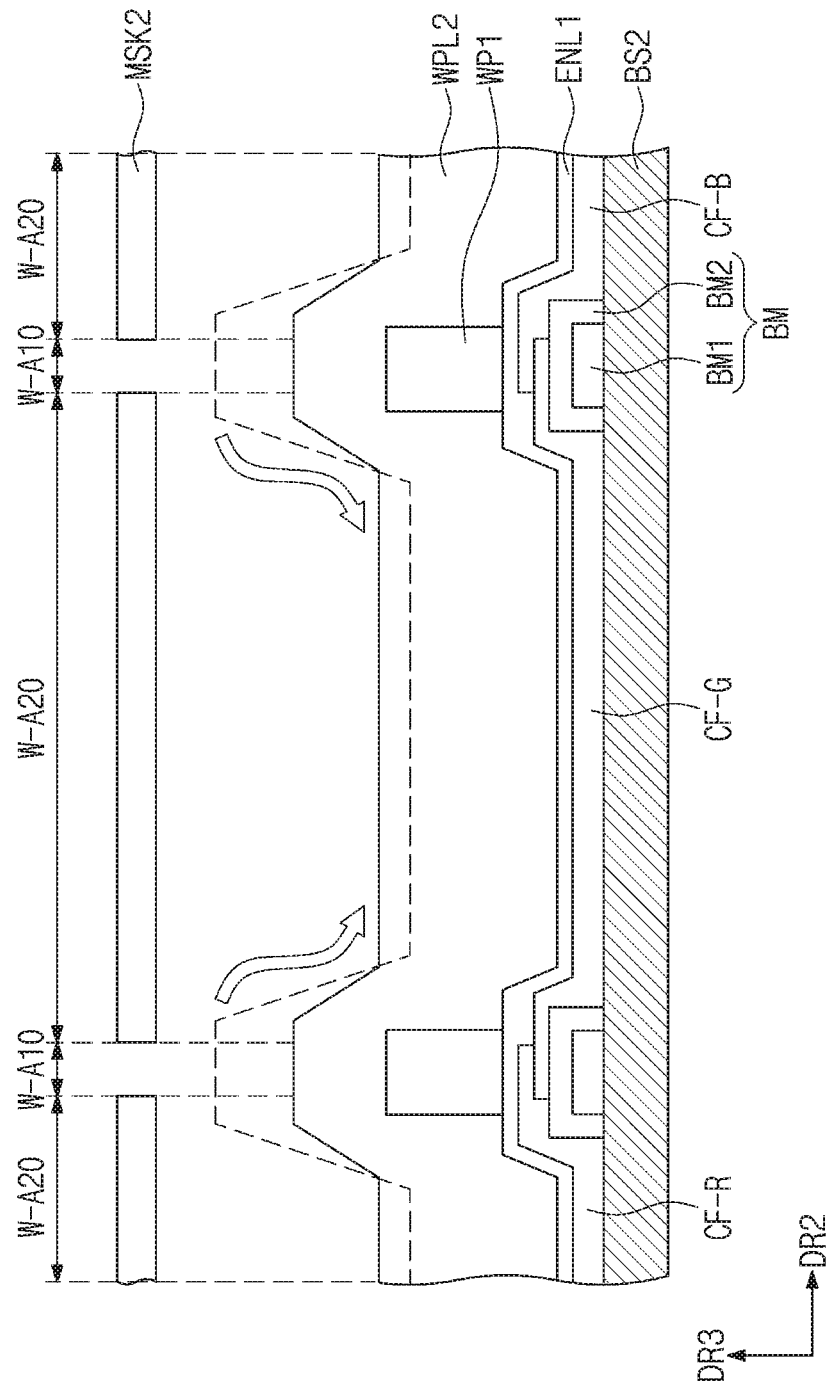

FIGS. 6A and 6B are drawings illustrating a fabrication method of the upper display substrate 200 according to an embodiment of the inventive concept.

FIG. 6A illustrates the second display substrate 200 after performing the process of FIG. 5B and a development process following the process of FIG. 5B. A first layer WP1 of the partition wall WP is formed on the first encapsulation layer ENL.

Then, as shown in FIG. 6B, the second preliminary partition wall layer WPL2 may be formed on the first encapsulation layer ENL1 and the first layer WP1. Even when coating is performed to have an upper surface as a dotted line with the second composition, the second composition flows after it is coated due to the fluidity of the second composition to form an upper surface as a solid line. In order to form the second preliminary partition wall layer WPL2 having the thickness shown in FIG. 5C, a larger amount of the second composition is needed.

The second preliminary partition wall layer WPL2 is exposed using the second mask MSK2, and a fourth region W-A20 is removed through the development process. In this process, a larger amount of the second composition is needed to form the second layer WP2 having the same thickness as disclosed in FIGS. 5A to 5E.

Figure 7A:
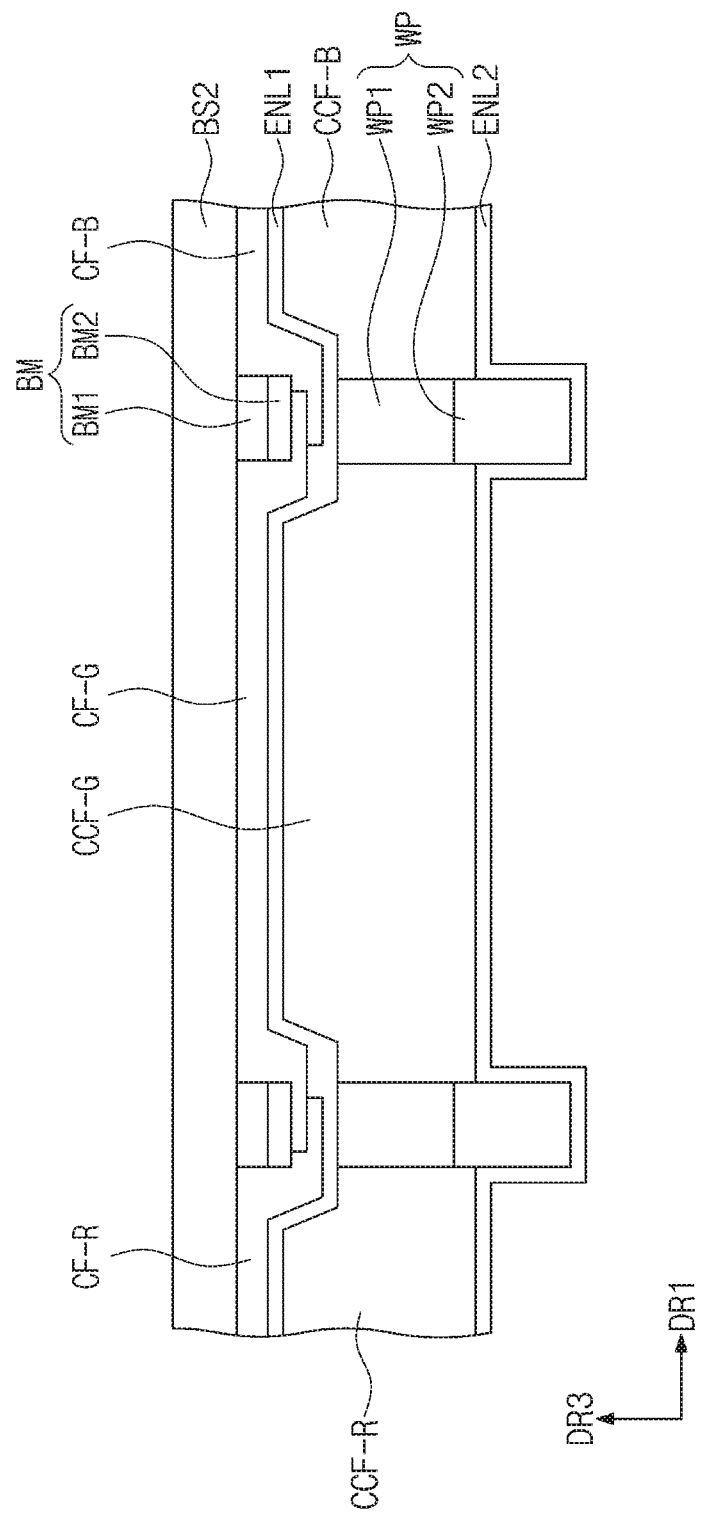
FIGS. 7A and 7B are cross-sectional views of a pixel region of an upper display substrate according to an embodiment of the inventive concept.
Figure 7B:
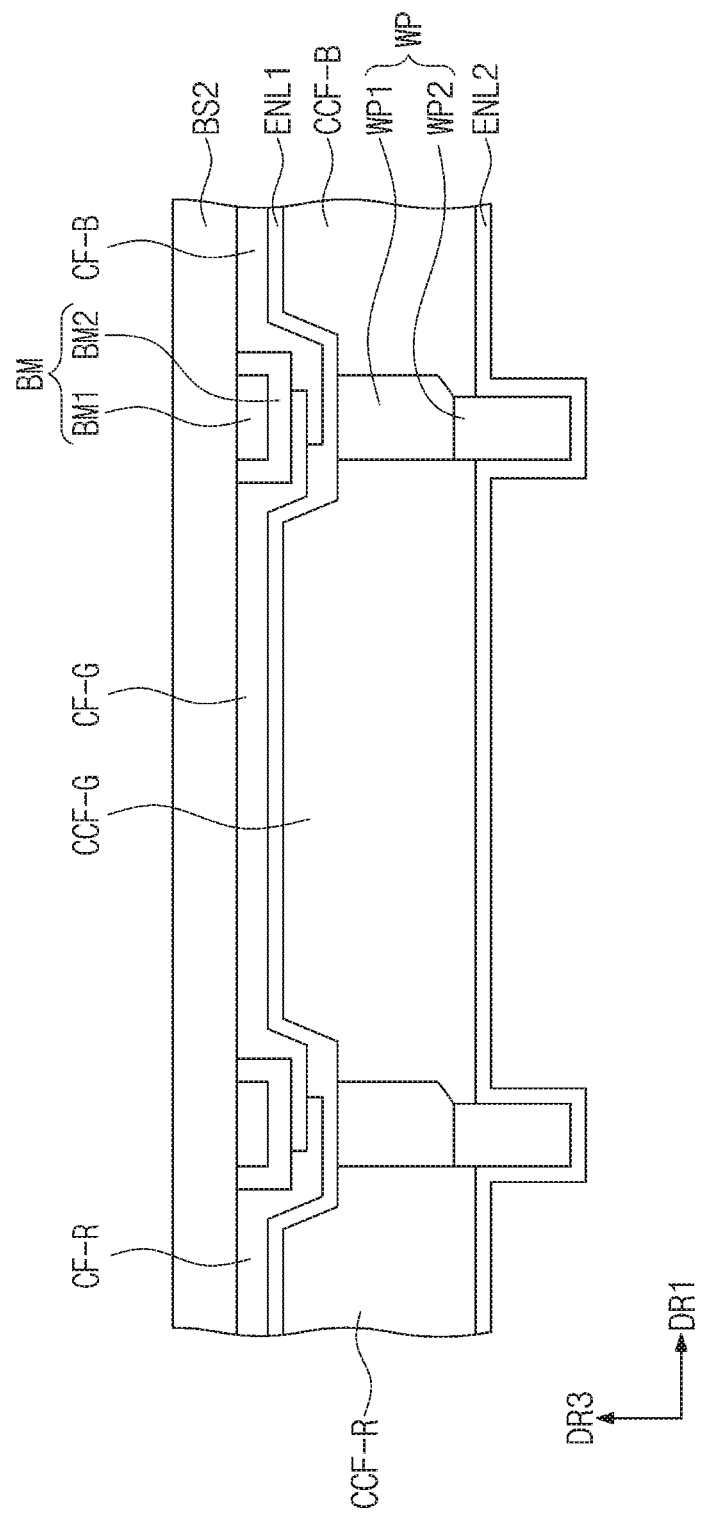

FIGS. 7A and 7B are cross-sectional views of a pixel region of the upper display substrate 200 according to an embodiment of the inventive concept. Hereinafter, detailed descriptions about the same configurations as those described in relation to FIGS. 1 to 6B will be omitted.

As shown in FIG. 7A, a first light shielding layer BM1 and a second light shielding layer BM2 may have the same width. After sequentially forming a first preliminary light shielding layer and a second preliminary light shielding layer, the first preliminary light shielding layer and the second preliminary light shielding layer may be patterned using a single exposure and a single development process. Alternatively, the first preliminary light shielding layer and the second preliminary light shielding layer may also be sequentially exposed.

As shown in FIG. 7B, one side surface of the first layer WP1 and one side surface of the second layer WP2 may be aligned in a substantially straight line. The first layer WP1 has a slanted portion toward one side of the second layer WP2 in comparison with the first layer WP1 in FIG. 3C.

As described above, according to the embodiments, the color control layers may have the thickness larger than a reference value, and thus a light amount changed in the color control layers increases. Accordingly, the luminance of the display panel may increase.

A light-shielding layer including a blue color filter and a black matrix may reduce a reflection amount of external light.

The partition wall may have a two-layered structure, and thus have the thickness larger than a reference value. In comparison with a first layer of the two-layered structure, a second layer, which has a larger absorbance than the first layer, is disposed adjacent to a lower display substrate to prevent color mixture between pixels.

Before a first preliminary partition wall layer is developed, a second preliminary partition wall layer is formed and then exposed to light. The development process is simplified by substantially simultaneously developing the first and second preliminary partition wall layers. A consumption amount of a composition for fabricating the second preliminary partition wall layer may be reduced.

While this invention has been described with reference to exemplary embodiments thereof, it will be clear to those of ordinary skill in the art to which the invention pertains that various changes and modifications may be made to the described embodiments without departing from the spirit and technical area of the invention as defined in the appended claims and their equivalents.

Thus, the scope of the inventive concept shall not be restricted or limited by the foregoing description, but be determined by the broadest permissible interpretation of the following claims.

What is claimed is:

1. A display panel comprising:
   an upper display substrate comprising first, second and third pixel regions, and a light shielding region in a periphery of the first, second and third pixel regions; and
   a lower display substrate comprising first, second and third display elements respectively corresponding to the first, second and third pixel regions,
   wherein the upper display substrate comprises:
      a base substrate;
      a light shielding pattern disposed on a bottom surface of the base substrate, overlapped with the light shielding region, and comprising first, second and third opening parts defined therein which respectively correspond to the first, second and third pixel regions;
      first, second and third color filters disposed on the bottom surface of the base substrate and respectively overlapped with the first, second and third pixel regions;
      a partition wall disposed in a lower side of the first, second and third color filters, overlapped with the light shielding region, and comprising first, second and third partition wall opening parts defined therein which respectively correspond to the first, second and third pixel regions; and
      first, second and third color control layers respectively disposed in the first, second and third partition wall opening parts,
   wherein the partition wall comprises a first layer and a second layer directly disposed on a lower side of the first layer and having an optical density greater than that of the first layer,
   a part of the second layer protrudes downward from the first, second and third color control layers in a cross sectional view,
   a side of the first layer of the partition wall is exposed from the second layer of the partition wall, and
   the exposed side of the first layer of the partition wall contacts the first color control layer in the first partition wall opening part.

2. The display panel of claim 1, wherein the optical density of the second layer is from about 0.15 to about 0.5 when a thickness of the second layer is 1 μm.

3. The display panel of claim 1, wherein the second layer comprises a hydrophobic region and a hydrophilic region disposed between the hydrophobic region and the first layer.

4. The display panel of claim 3, wherein the second layer has a thickness of from about 7 μm to about 10 μm.

5. The display panel of claim 4, wherein the hydrophilic region comprises a base resin and a black coloring agent mixed with the base resin, and the hydrophobic region comprises a hydrophobic agent chemically bonded to the base resin.

6. The display panel of claim 3, wherein the hydrophobic region has a thickness of from about 30 nm to about 200 nm.

7. The display panel of claim 1, wherein each of the first, second and third color control layers has a thickness of about 15 μm or larger.

8. The display panel of claim 7, wherein a height of the partition wall in the light shielding region is higher than that of each of the first, second and third color control layers.

9. The display panel of claim 7, wherein the first layer has a thickness of about from 5 μm to about 15 μm, and
   the second layer has a thickness of from about 5 μm to about 10 μm.

10. The display panel of claim 1, wherein a width of the first layer is about from 10 μm to about 15 μm.

11. The display panel of claim 1, wherein the second layer is completely overlapped with the first layer in a plan view.

12. The display panel of claim 1, wherein the light shielding pattern comprises a first light shielding layer of a blue color and a second light shielding layer of a black color, which covers at least a bottom surface of the first light shielding layer.

13. The display panel of claim 1, wherein each of the first, second and third display elements comprises a first electrode, a second electrode, and an emission layer disposed between the first electrode and the second electrode, and
   the emission layers of the first, second and third display elements have an integrated shape and generate blue light.

14. The display panel of claim 13, wherein the first color control layer comprises a first quantum dot configured to convert the blue light into red light,
   the second color control layer comprises a second quantum dot configured to convert the blue light into green light, and
   the third color control layer transmits the blue light.

15. A display panel comprising:
   an upper display substrate comprising a pixel region and a peripheral region adjacent to the pixel region; and
   a lower display substrate comprising a display element disposed to correspond to the pixel region,
   wherein the upper display substrate comprises:
      a base substrate;

a light shielding pattern disposed on a bottom surface of the base substrate, overlapped with the peripheral region, and comprising an opening part defined therein which corresponds to the pixel region;

a color filter disposed on the bottom surface of the base substrate and overlapped with the pixel region;

an encapsulation layer disposed on lower sides of the light shielding pattern and the color filter;

a partition wall disposed on a lower side of the encapsulation layer, overlapped with the peripheral region, and comprising a partition wall opening part defined therein which corresponds to the pixel region; and a quantum dot layer disposed in the partition wall opening part, wherein the partition wall comprises a first layer directly disposed on the bottom surface of the encapsulation layer, and a second layer directly disposed in a lower side of the first layer and having a larger optical density than the first layer.

* * * * *